United States Patent
Kinoshita et al.

(10) Patent No.: US 6,819,693 B2
(45) Date of Patent: Nov. 16, 2004

(54) SAPPHIRE MONOCRYSTAL, SEMICONDUCTOR LASER DIODE USING THE SAME FOR SUBSTRATE, AND METHOD FOR MANUFACTURING THE SAME

(75) Inventors: Hiroyuki Kinoshita, Gamo-gun (JP); Motohiro Umehara, Gamo-gun (JP)

(73) Assignee: Kyocera Corporation, Kyoto (JP)

(*) Notice: Subject to any disclaimer, the term of this patent is extended or adjusted under 35 U.S.C. 154(b) by 0 days.

(21) Appl. No.: 10/444,044

(22) Filed: May 22, 2003

(65) Prior Publication Data

US 2004/0109486 A1 Jun. 10, 2004

Related U.S. Application Data

(62) Division of application No. 08/808,315, filed on Feb. 28, 1997.

(30) Foreign Application Priority Data

Feb. 29, 1996 (JP) .............................................. 8-43862
Feb. 29, 1996 (JP) .............................................. 8-43863

(51) Int. Cl.⁷ .................................................. H01S 5/00
(52) U.S. Cl. ....................................................... 372/43
(58) Field of Search ............................. 372/43, 45, 46; 438/460

(56) References Cited

U.S. PATENT DOCUMENTS

| | | |
|---|---|---|
| 4,161,167 A | 7/1979 | Reglar et al. ................. 125/18 |
| 4,442,178 A | 4/1984 | Kimura et al. |
| 4,662,124 A | 5/1987 | Kato et al. ..................... 51/283 |
| 5,403,773 A | 4/1995 | Nitta et al. ................. 437/126 |
| 5,753,966 A | 5/1998 | Morita et al. ............... 257/627 |
| 5,787,104 A * | 7/1998 | Kamiyama et al. ........... 372/43 |

FOREIGN PATENT DOCUMENTS

| | | |
|---|---|---|
| EP | 6-88070 | 12/1995 |
| JP | 60-200212 | 10/1985 |
| JP | 61-121042 | 6/1986 |
| JP | 2-291147 | 11/1990 |
| JP | 7-297495 | 11/1995 |
| JP | 9-214051 | 8/1997 |

* cited by examiner

Primary Examiner—Minsun Oh Harvey
Assistant Examiner—James Menefee
(74) Attorney, Agent, or Firm—Hogan & Hartson LLP

(57) ABSTRACT

The present invention relates to a sapphire monocrystalline body to be used as the substrate for a semiconductor for electronic parts or component parts, and to a monocrystalline sapphire substrate. The invention also relates to a method for working the same. The invention is based cleavage along the plane R of the sapphire monocrystalline body which cleavage is easy to accomplish and provides a surface high in precision. The inventive process includes forming linear crack parallel or vertical to a reference plane of the substrate, with a microcrack line as a starting point, to develop a crack in a thickness direction of the body.

3 Claims, 6 Drawing Sheets

SAPPHIRE MONOCRYSTAL, SEMICONDUCTOR LASER DIODE USING THE SAME FOR SUBSTRATE, AND METHOD FOR MANUFACTURING THE SAME

This application is a divisional of Ser. No. 08/808,315 filed Feb. 28, 1997.

BACKGROUND OF THE INVENTION

1. Field of the Invention

The present invention relates to a sapphire monocrystal provided with a smooth cleavage plane, more particularly, to a monocrystal sapphire substrate easier to cleave, so as to be used as a substrate, of thin film growth, such as semiconductor or the like, for electronic parts or structure parts, and to a method of working the same. Furthermore, the invention relates to a semiconductor laser diode using such a monocrystal sapphire substrate and a method of manufacturing the same.

2. Prior Art

The sapphire monocrystal, i.e., $Al_2O_3$, is used for usage of wider range, because it has higher clear-degree, hardness and comparatively smoother plane. The sapphire of the monocrystal is pulled, growing a seed crystal in contact with the surface of the molten alumina to produce the monocrystal into a larger monocrystal, so as to generally work the monocrystal into the desired shape.

A method of working the sapphire monocrystal comprises mechanical working such as grinding, abrading or the like with the use of diamond grindstone, diamond grinding gains, chemical etching working with the use of corroding phenomena, and furthermore, growing finer microcrack, formed on the surface with a diamond needle point pen tip, so as to effect a cleaving, breaking operation.

Such working methods as described above are difficult to obtain a smoother surface in a short time. The mechanical working with diamond grindstone is longer in working time and is higher in working cost. The chemical etching operation, which has an advantage capable of easily compensating the sapphire face smoothly, takes approximately 10 hours for effecting the etching operation of 1 mm in thickness, and is hard to obtain the smooth face of sub-micron unit. Also, the breaking, working method with the diamond needle point pen tip is worse in the accuracy of the worked surface, and is difficult to obtain the smooth face.

The sapphire monocrystal is used to form the laser light emitting element, composed of multiple semiconductor layers, on the surface of the substrate as a substrate of the semiconductor laser element. In the semiconductor laser diode, whose schematic structure is shown in FIGS. 6 and 7, a semiconductor multilayer 3 for composing the laser light emitting element is formed through a buffer layer 2 on the surface of the monocrystal sapphire substrate 1 to have a resonator of laser beam between a pair of opposite end faces 3a and 3a of the multilayer 3. The pair of end faces 3a and 3a are smooth reflection end faces extremely higher in precision and simultaneously, the parallelism of both the faces is required to be extremely made higher, so as to improve the oscillation efficiency.

Although a method of growing a semiconductor thin film on the major plane of the monocrystal sapphire substrate to form patterns, and then, diving the substrate into a chip shape is used to produce, generally, the semiconductor element including a laser diode, the above described conventional methods are hard to divide with better precision, so as to reduce the yield of producing the chips. Although the chip division plane is used as the reflection end face, especially when the semiconductor thin film is grown further into a multilayer on the substrate, and then, divided into chips for every substrate as the semiconductor laser diode, the higher precision of a sub-micron level to be demanded for the reflection end face cannot be achieved by the above described working method.

As for this problem, although Japanese Patent Application Laid-Open A7-27495 discloses that the monocrystal sapphire substrate is cleaved, divided into parallel to the axis C <0001> of the sapphire crystal, this method is incapable of obtaining the smoother surface of high precision.

An object of the invention is to provide, first, a sapphire monocrystal having a smoother division plane higher in precision, and a monocrystal sapphire substrate.

Another object of the invention is to provide a dividing method of a sapphire monocrystal capable of forming such a precise division plane in short time on the sapphire monocrystal.

Still another object of the invention is to provide a semiconductor laser diode provided a precise smooth plane on the end face of the resonator of the monocrystal sapphire substrate.

A further object of the invention is to provide a method of forming a precisely smoother plane on the resonator end face of the monocrystal sapphire substrate to manufacture a semiconductor laser diode.

SUMMARY OF THE INVENTION

The invention applies a plane R to the formation of the smoother surface of the sapphire monocrystal with the use of a fact where the plane R of the sapphire monocrystal is easier to cleave and the cleavage plane is a smooth plane of higher precision. Now, the R plate is referred to as the (1–102) plane indicated with hexagonal indices.

The sapphire monocrystal having such a plane R for the cleavage plane includes a sapphire tool, the other structure members or a monocrystal sapphire substrate having the cleavage plane on its side face. Such a sapphire monocrystal plate is used as a monocrystal sapphire substrate whose major plane has elements such as semiconductor elements, functional elements and so on.

The invention detects the plane R existing within the sapphire monocrystal body to cleave along the plane R, so as to divide the monocrystal body and have it on the surface of the smooth plane R on the monocrystal body. To simplify division of the sapphire monocrystal body or the substrate by the cleavage, the invention includes an index, for controlling the plane R in the dividing, with the reference plane related to the plane R being formed in, for example, the monocrystal body or, for example, the edge portion of the substrate, by previous specification of the plane R of the monocrystal sapphire in the X-ray crystal study.

More concretely, in the example of the monocrystal sapphire substrate, the reference plane which is substantially parallel to or substantially vertical to the plane R is provided on the periphery of the substrate. For the cleaving operation, a method is adopted for forming a linear crack which is parallel to or vertical to the reference plane of the substrate is formed, and having the microcrack line as a start point to develop the crack in the thickness direction for a cleaving operation.

Also, in the monocrystal sapphire substrate of the invention, the monocrystal sapphire substrate where the semiconductor multilayer is formed is cleaved, separated along the plane R to form a cleavage plane connected with the semiconductor multilayer and the substrate in a substrate where a laser diode is formed for forming the semiconductor multilayer on the major plate of the substrate. The cleavage plane of the semiconductor multilayer is also an extremely smooth plane. The invention uses it for the reflection lane for laser resonator use of the semiconductor multilayer.

A semiconductor laser diode using the monocrystal sapphire substrate of the invention comprises a semiconductor multilayer composing a laser element on the major plane of the monocrystal sapphire substrate, and is characterized in that two reflection end planes for composing the resonator of the laser beam in the multilayer are cleaved planes connected with the cleaved plane along the plane R of the crystal of the monocrystal substrate.

A method of manufacturing a laser diode of the invention comprises steps of using a monocrystal sapphire substrate provided with the reference plane, forming the semiconductor multilayer for emitting the laser beam the multiple on the major plane, then cleaving the monocrystal sapphire substrate and the semiconductor layer along the R face with the reference plane of the sapphire monocrystal as an index. By this method, they are divided quickly and easily into many laser diode chips provided with smooth cleaved face on both the end planes of the semiconductor multilayer.

BRIEF DESCRIPTION OF THE DRAWINGS

The invention is to be explained for further description with reference to the following drawings.

DETAILED DESCRIPTION OF THE INVENTION

Figure 1:
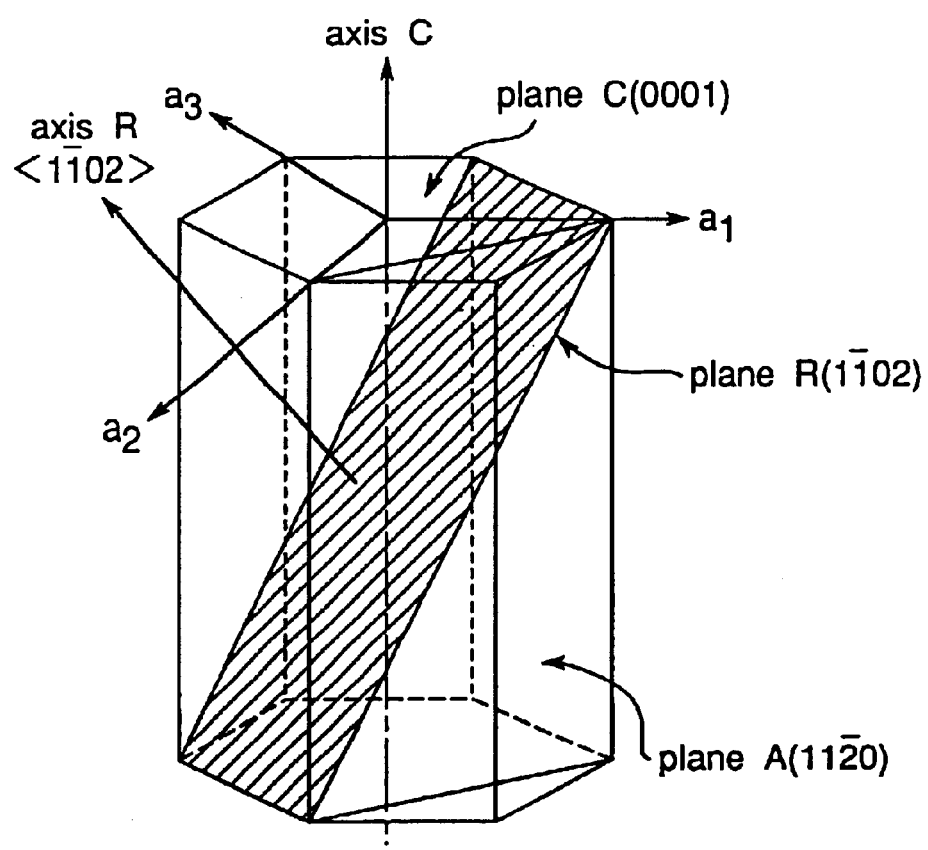
FIG. 1 is a sapphire crystal structure.

In the crystal structure of a sapphire, as shown in FIG. 1, the sapphire crystal is a hexagonal system, wherein a axis C for forming a central axis, a plane C (0001) vertical to it, an axis A (axis $a_1$, axis $a_2$, axis $a_3$) to be extended in three directions vertically from the axis C and respectively vertical plane A (11–20), and the plane R (1–102) oblique at a constant angle to the axis C, and a axis R vertical to it exist when the major axis and plane of the crystal system are expressed with hexagonal indices. The planes and axes of the sapphire can be analyzed with X ray diffraction and can be determined about the actual sapphire monocrystal.

The plane R of the actual sapphire monocrystal is easier to cleave and the cleavage plane is a smooth plane of extremely high precision, whereby the sapphire monocrystal body or the sapphire monocrystal plate can be used as a surface of higher precision and higher linearity by cleaving along the plane R. In this example, a sharp edge formed by the working plane and the cleavage plane of the plane R can be used as a sapphire tool as described later.

Also, the sapphire monocrystal is widely used as a sapphire plate having a cleavage plane, parallel to the plane R, as a side plane, or especially as a sapphire plate substrate.

To use the plane R of the sapphire monocrystal for the cleavage plane, a means for realizing the plane R of the crystal on the actually desired surface is required to provide. In one embodiment of the invention, and a reference plane 12 parallel or vertical substantially to the plane R detected the sapphire monocrystal in advance is provided in advance in the sapphire monocrystal plate 10. When the monocrystal plate is a substrate to be used for forming the semiconductor layer or the like on the major plane 11, it is convenient to form the reference plane 12 as the side end plane as part of the peripheral edge portion of the sapphire monocrystal plate or a monocrystal sapphire substrate.

The reference plane substantially parallel to or vertical to the plane R is in an angle range within ±10° from an orientation parallel or vertical completely to the plane R in the reference place, and especially, is preferable to be within ±2° in angle range.

Figure 2A:
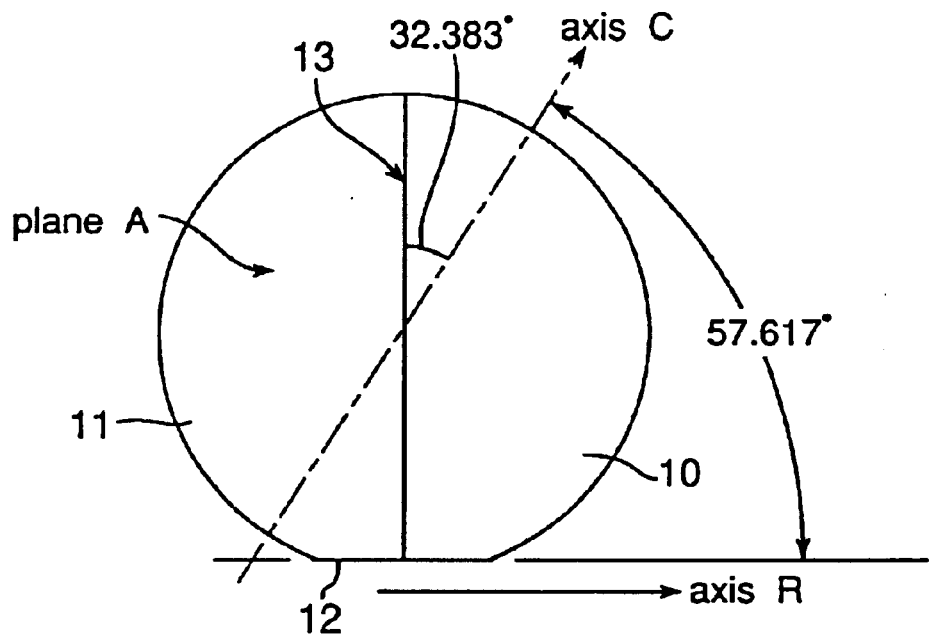
FIG. 2 shows a front view (A) and a side view (B) of a monocrystal sapphire substrate wherein a reference plane is provided on the substrate side face, a microcrack line vertical to the plane R and parallel to on the major plane of the substrate.
Figure 2B:
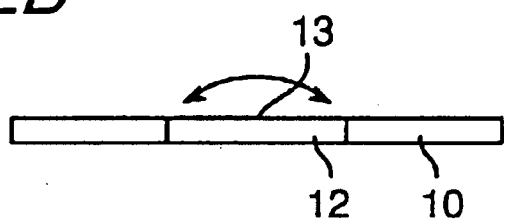
Figure 2C:
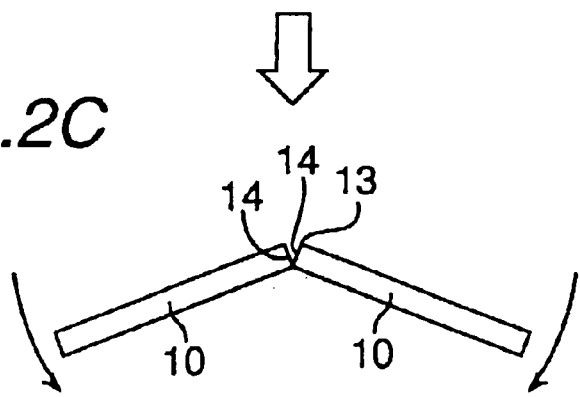

More concretely, the sapphire substrate 10 will be described hereinafter. As shown in FIG. 2 (A), the major plane 11 of the monocrystal sapphire substrate 10 is parallel to the plane A (11–20) and parallel to the axis R. The reference plane 12 is formed parallel to the axis R, namely, is formed vertical to the plane R (1–102) on the side face of the substrate. Thus, the plane R is vertical to the major plane 11, and is vertical even to the reference plane 12. Furthermore, the axis C is formed at an angle of 57.615° to the reference plane 12. In this manner, the sapphire monocrystal formed on the reference plane 12 can be used as the substrate for forming the element such as semiconductor element or the like.

To cleave and divide the monocrystal sapphire substrate, linear microscopic scratch flaw, i.e., microcrack line 13 is drown in a direction vertical to the reference plane 12 on the main plane 11 (or its reverse plane) with the use of a diamond needle point pen to form a crack starting point on the surface. Since the reference plane 12 is in a direction of forming an angle of 32.383° with respect to the axis C, i.e., in the axis R direction, the microcrack line 13 vertical to the reference plane 12 is within the plane R (1–102), i.e., the direction of the microcrack line 13 becomes a direction of the plane R (1–102). Actually, an error between the orientation of the microcrack line 13 and the orientation of the plane R is to be within ±10°, and preferably within ±5°.

Then, apply a bending stress in a direction of widening the microcrack line 13 upon the monocrystal sapphire substrate 10, and a crack along the microcrack line 13 is grown rapidly in the thickness direction of the substrate and is cleaved as in FIG. 2 (B), so as to divide the substrate 10 into two parts. The planes on both the sides where the crack is formed become cleavage planes 14 and 14 parallel to the plane R. In this example, the cleavage plane is vertical precisely to the major plane 11. Since the cleavage plane is in a condition aligned at an atomic level, the linear property and the smooth property can be obtained in sub-micron unit. Actually the measured value of the division plane, in surface roughness (Ra), cleaved along the plane R becomes 10 Å or lower, depending upon the conditions of the division.

In the substrate shown in FIG. 2, grow the sapphire by an EFG method (Edge-Defined Film-Fed Growth Method) of setting a seed crystal wherein a pulling axis is made the axis R <1–102>, and the major plane is made the plane A (11–20) within a melting furnace (see FIG. 1). Then, cut the monocrystal in a pulling direction, namely, vertically to the axis R and conduct a precise working operation, and a disk (for example, 50 mm in diameter, 0.425 mm in thickness) where the orientation flat is made parallel to the axis R and the major plane is made an plane A is easily obtained. The crystal precision of the material is obtained by managing of the seed crystal.

Figure 3A:
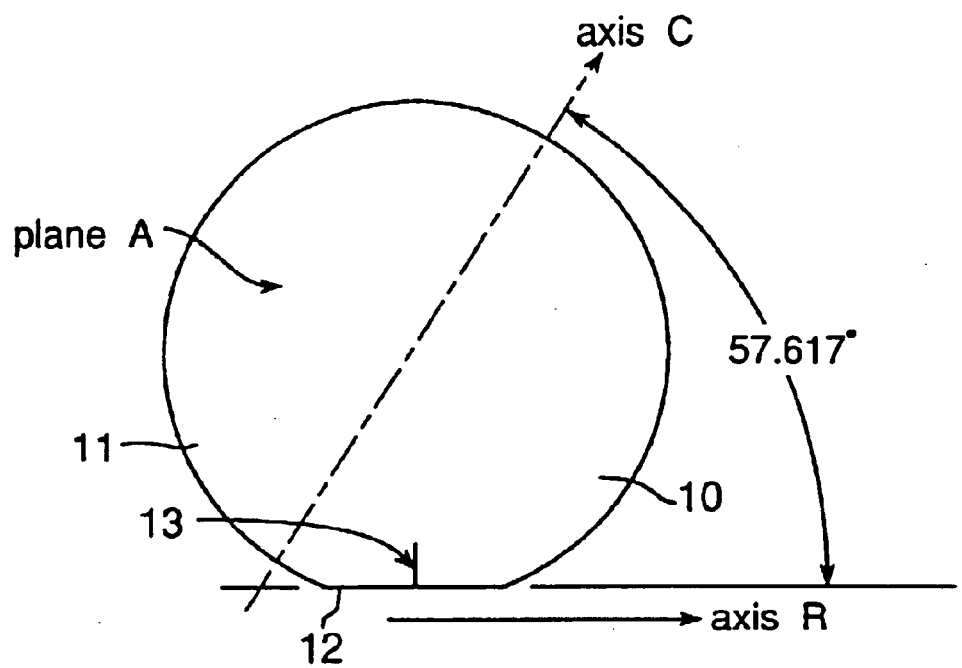
FIG. 3 shows a front view (A) and a side view (B) of a monocrystal sapphire substrate where a microcrack line is formed in part on the end portion side of the substrate top plane, and a side view (C) in a cleaved condition.
Figure 3B:
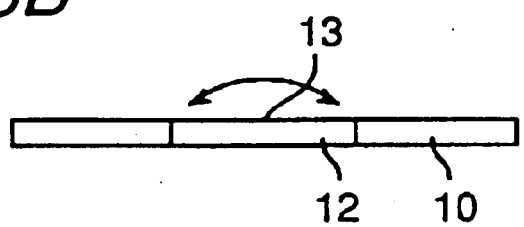
Figure 3C:
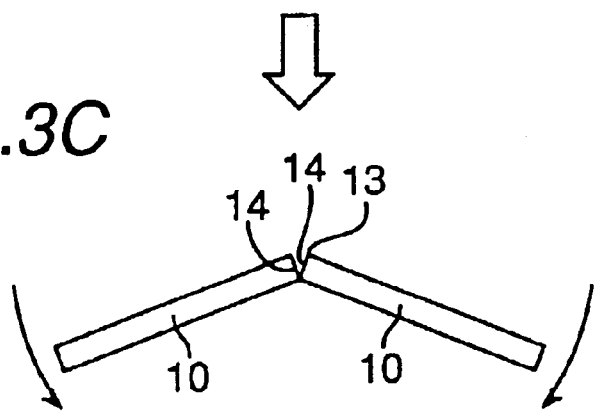

As shown in FIG. 3 (A), the microcrack line 13 to be formed by a diamond needle point pen can be formed partially only in the peripheral edge portion (for example, in the range of 5 through 20 mm from the edge end portion in the example of the substrate of 50 mm in diameter) of the crystal sapphire substrate 10. In this manner, the damaged portion of the substrate surface by the microcrack line can be made minimum, so as to improve the yield of the chip after the division thereof. Even in this case, as shown in FIG. 3 (B), apply the bending stress upon the monocrystal sapphire substrate for growing of a crack in the thickness direction and the extending direction of the microcrack line, and the linear property and smooth property of the sub-microscopic unit can be obtained as in the cleavage plane with the substrate after the division thereof being a cleaved plane in both the planes of the crack.

Figure 4A:
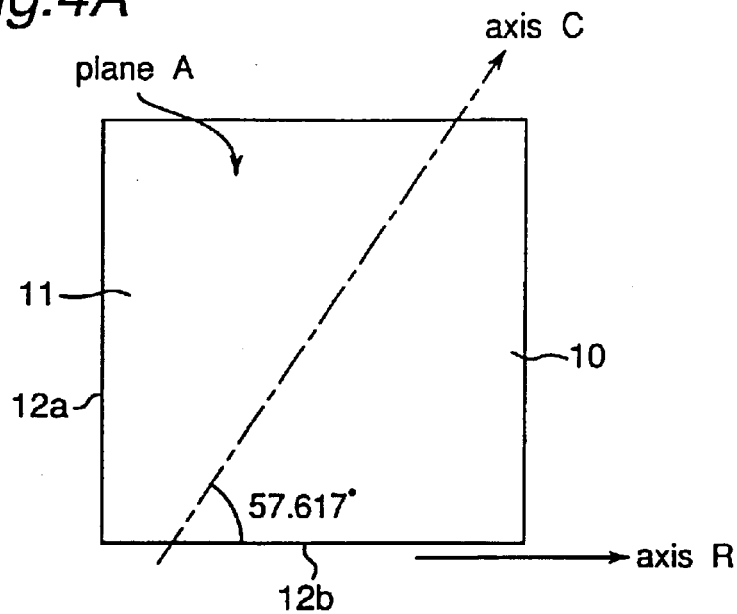
FIG. 4 is a similar view to the monocrystal sapphire substrate view 2 whose substrate is rectangular.
Figure 4B:
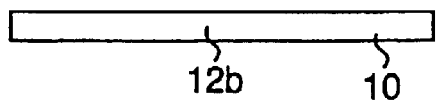

In FIG. 4, an example of rectangular monocrystal sapphire substrate 10, the major plane 11 is an plane A, one reference plane 12a is formed to be parallel to the plane R, and another reference plane 12b is formed to be vertical to the plane R. Therefore, form a microcrack line 13 in a direction parallel to the reference plane 12a and apply the bending stress for widening the microcrack line 13, and the substrate 10 is cleaved along the plane R, so as to divide it. The rectangular monocrystal sapphire substrate 10 having the reference planes 12a and 12b parallel or vertical to the plane R in this manner can use the surface area effectively.

In this manner, form the reference plane 12, in a direction vertical to or parallel to the plane R, on the monocrystal sapphire substrate 10, and the direction of the plane R can be obtained easily. Form the microcrack line 13 related to the reference plane 12 on the major plane and break it for a cleaving operation, and parallel plural or multiple microcrack line 13 can be formed and the substrate 10 can be divided into plural or multiple ones easily. In this manner, an efficient dividing operation of the substrate can be conducted by the previous forming of the reference plane vertical or parallel to the plane R on the monocrystal sapphire substrate.

Figure 5A:
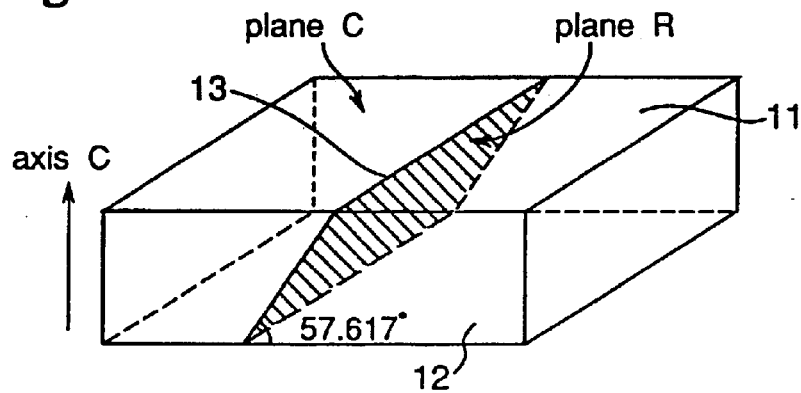
FIG. 5 shows the arrangement of the plane R when the major plane of the rectangular substrate is a plane C.
Figure 5B:
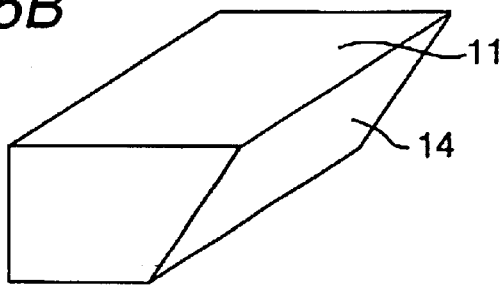

Such a monocrystal sapphire substrate 10 as shown in FIG. 5 is rectangular, whose major plane 11 is made a plane C, and the reference plane 12 is made vertical to the plane R. Therefore, form a microcrack line 13 in a direction vertical the reference plane 12 on the major plane 11 (or on the reverse plane approximate parallel to the major plane) and apply the bending stress, and it can be cleaved, divided along the plane R. In this case, as shown in FIG. 5, to form the angle of 57.615° between the plane R, parallel to the cleavage plane, and the major plane 11, it is inclined in the thickness direction and divided as in FIG. 5 (B). Since the sharp edge is formed between the major plane 11, as the working plane, and the cleavage plane 14 of the division plane, such substrate can be used for a sapphire tool such as cutter, tape cleaner or the like.

In the invention, the reference plane 12 in a direction vertical or parallel to the plane R is such that the reference plane 12 stays within the range of the angle in ±10° or lower from a position completely vertical or parallel to the plane R (1–102), and preferably, in ±2° or lower.

Also, although the major plane 11 for forming the microcrack line 13 is not usually necessary to be made the plane A or the plane C, it is preferably to have the major plane as a mirror plane of 0.1 μm or lower in surface roughness (Ra) although any orientation relation is allowed. This is why the major plane 11, if rough after the a rough working operation thereof, interferes with the crack growth of the microcrack line formed due to existence of innumerable microcrack line on the surface.

A method of propagating the crack comprises a method of applying such mechanical bending deformation as described above, and a method of applying a laser beam irradiating operation, a heating-wire heating operation, an infrared rays lamp irradiating operation or the like upon the major plane along the microcrack line to causing thermal stressing, and using the stressing for induction of the crack growth.

The monocrystal sapphire substrate obtained in the above description can be available in various fields, because the substrate has a smooth plane R in cleavage plane by cleaving and separating along the plane R. As the range for application, a method of forming the thin film of the semiconductor or the like in advance on the major plane of the monocrystal sapphire substrate 10, then cleaving, separating operations along the plane R, and dividing a plurality of elements can be widely used.

In the other embodiments of the invention, the monocrystal sapphire substrate provided with the cleavage plane of such a plane R as described above can be used suitably as the substrate for the laser diode use. Namely, in the semiconductor laser diode, a semiconductor multilayer for forming the laser light emitting element is formed by the epitaxial growth on the major plane of the monocrystal sapphire substrate to make the substrate a cleavage plane, cleaved along the plane R so that the cleavage plane of the growth layer continuous to the cleavage plane at the same time even to the semiconductor multilayer on the substrate. Although two side planes of the semiconductor multilayer are the cleavage planes of the semiconductor multilayer, the cleavage planes are also planes smooth extremely in the atomic level, thus resulting in the mutually opposite reflection planes of the resonator.

Figure 8:
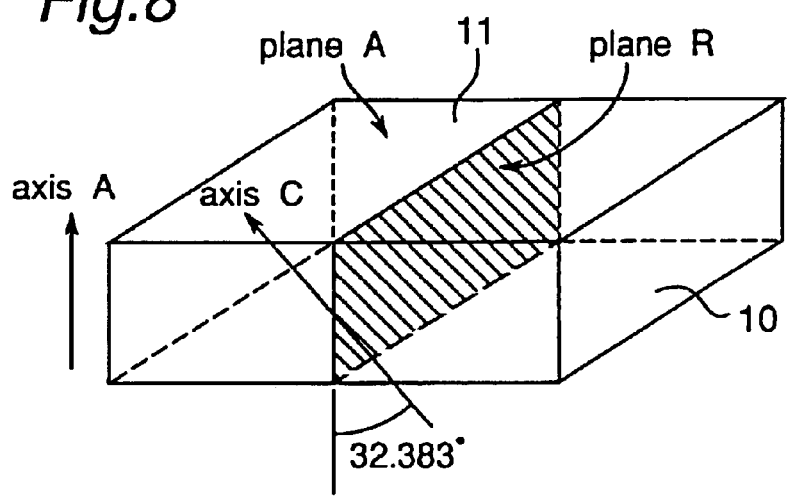
FIG. 8 shows the arrangement of the plane R when the major plane of the rectangular monocrystal sapphire substrate is made an plane A.

For an optical resonating operation, it is suitable to make both the end faces 3a and 3a of the semiconductor multilayer 3 vertical to the layer plane of the semiconductor multilayer, and furthermore, both the end planes 3a and 3a are required to be parallel to each other. The monocrystal sapphire substrate to be used for the semiconductor laser element is desired to be vertical especially between the major plane 11 for forming the semiconductor multilayer and the cleavage plane of both the end faces. Such relation is given in the orientation relation wherein the major plane is made an plane A, and the plane vertical to the major plane becomes the plane R. As shown in FIG. 8, the angle between the axis C of the monocrystal and the plane vertical to the major plane (plane A) becomes 32.383°, the plane vertical to the major plane becomes a cleavage plane parallel to the plane R.

As shown in FIG. 4, the monocrystal sapphire substrate 10 to be used for the laser diode is made the reference plane 12 by the previous formation of any end plane of the substrate precisely parallel to the plane R on the rectangular substrate. Form the semiconductor multilayer 30 on the monocrystal sapphire substrate, and then, draw the microcrack line parallel to the reference plane by plural at intervals of the distance between the reflection planes of the resonator. Then, apply bending stress for spreading the microcrack line, and the crack with the microcrack line as a starting point is developed in the thickness direction along the plane R, and the sapphire substrate and the semiconductor multilayer connected the sapphire substrate are continuously cleaved.

The cleavage plane 14 of the sapphire substrate is extremely smooth in the atomic level as described above, and the cleavage plane of the semiconductor multilayer formed at the same time is also a smooth mirror plane extremely higher at the atomic level, so as to be sufficiently used as the reflection planes 3a and 3a of the resonator. The microcrack lines can be formed on the substrate in parallel by plural at intervals between the opposite reflection planes of the resonator. The substrate can be cleaved and divided sequentially along each microscopical line such that the reflection plane higher in parallelism can be provided. Therefore, a plurality of laser diodes of increased efficiency of the laser beam can be manufacture.

A monocrystal substrate for laser diode use and a method of manufacturing the laser diode using it will be described hereinafter.

Concretely, a laser diode provided now is composed of a gallium nitride system compound semiconductor

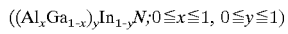

$((Al_xGa_{1-x})_yIn_{1-y}N; 0 \leq x \leq 1, 0 \leq y \leq 1)$ of double hetero junction structure with an activated layer being grasped with layers having a forbidden band width larger than the forbidden band.

Figure 6:
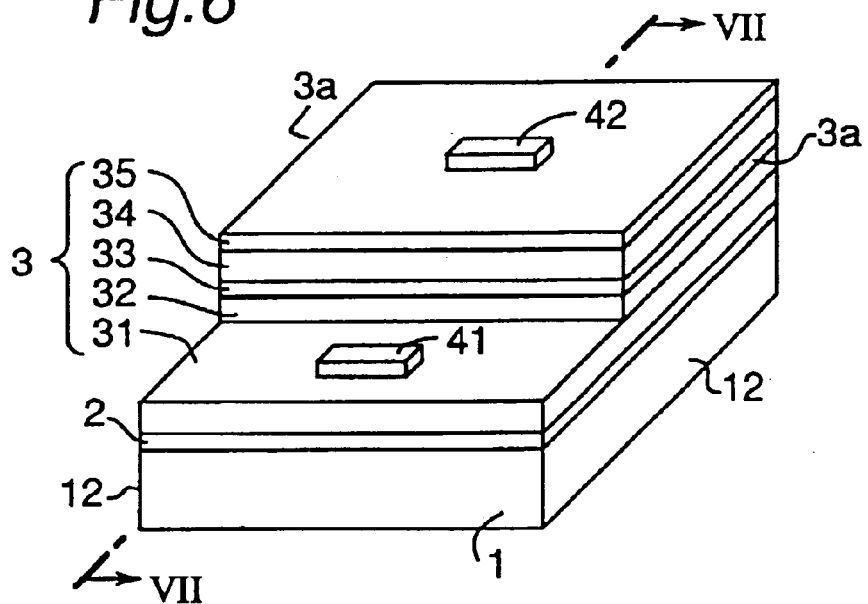
FIG. 6 is a perspective view showing the structure of the laser diode of a gallium nitride system double hetero bonding type.
Figure 7:
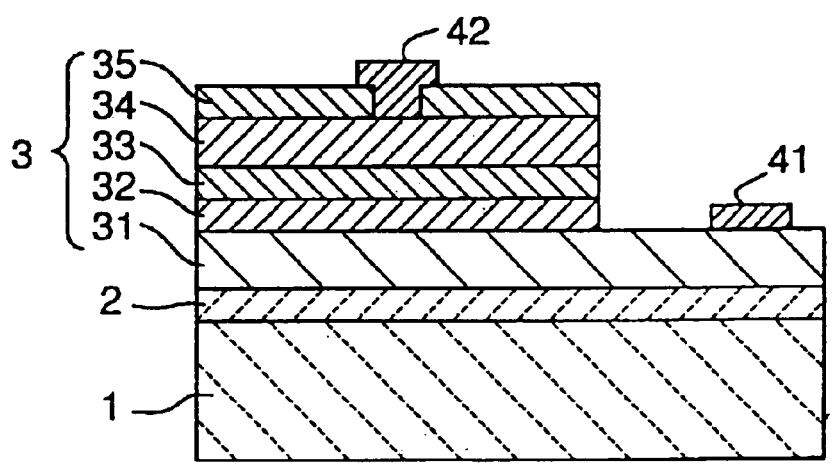
FIG. 7 is a sectional structure of a laser diode of a double hetero bonding type.

Referring now to the laser diode, FIG. 6 shows a perspective view of the essential portions and FIG. 7 shows a sectional view thereof. The monocrystal sapphire substrate 1 has the major plane as the plane A and the plane R cut into a plate vertical to the major plane from the sapphire monocrystal as shown in FIG. 8. The laser diode is provided with a buffer layer 2 composed of AlN on the major plane 11 of the monocrystal sapphire substrate 1, and is provided with a semiconductor multilayer 3 for composing the laser element on the buffer layer 2.

The multiple layer 3 comprises a n$^+$ layer 31 composed of a Si doped n—CaN layer formed on the whole plane of the buffer layer 2, an electrode 41 on the n$^+$ layer 31, a n layer 32 composed of a Si doped $Al_{0.9}Ga_{0.1}N$ layer formed on the n$^+$ layer 31 except for the electrode 41, an activated layer 33 composed of Si doped GaN layer, a p layer 34 composed of a magnesium doped $Al_{0.9}Ga_{0.1}N$ layer, a $SiO_2$ layer 35 for covering it, and an electrode 42 connected with the window portion of the $SiO_2$ layer 35.

The manufacturing process comprises washing the monocrystal sapphire substrate 1 with an organic solvent, then arranging in the crystal growth portion within the crystal growing apparatus, heating to approximately 1200° C. in the hydrogen atmosphere by a vacuum-exhausting operation, and removing hydrocarbon attached onto the surface of the substrate.

The substrate 10 is heated to 600° C., growing an AlN layer of about 50 nm in thickness on the major plane 11 (namely, the plane A) of the substrate by suppling the trimethylene aluminum (TMA) and ammonia as a buffer layer 2. Trimethylene gallium (TMG), the ammonia and silane are supplied with the temperature of the substrate being 1040° C. to form a n$^+$ layer 31 composed of a Si droped n—GaN layer.

The substrate 10 is taken out of the growth furnace and one portion of the surface of the n$^+$ layer 31 is made with $SiO_2$ and then, is heated again within the growth furnace to 1040° C. to supply the TMA, TMG and silane. A n layer 32 composed of Si doped $Al_{0.9}Ga_{0.1}N$ layer of 0.5 μm in thickness.

Furthermore, the TMG and silane are supplied to form activated layer 33 composed of Si doped GaN layer of 0.2 μm in thickness. Then, supply the TMG and $Cp_2$ Mg (bis-cyclopenta-dienyle-magnesium) to form the a p layer 34 composed of a magnesium doped $Al_{0.9}Ga_{0.1}N$ layer of 0.5 μm in thickness.

Remove $SiO_2$ used as a mask by hydrofluoric acid system etchant and the $SiO_2$ layer 35 is piled on the a p layer 34. Then, a long strip of window of 1 mm in length and 80 μm in width is opened to apply an electronic line irradiation upon the p layer 34 in vacuum as the p layer 34 shows p-conduction. Then, metal electrodes 31 and 31 are connected respectively with the window portion of the p layer 34 and the n$^+$ layer 31.

Since the multilayer 3 of the semiconductor is formed on the major plane 11 of the monocrystal sapphire substrate 1 in this manner, the substrate and the multiple layer are cleaved, divided simultaneously integrally along the plane R of the substrate such that laser diode provided with the reflection plane on the end face shown in FIGS. 6 an 7 can be obtained.

Strictly speaking, in the laser diode composed of the gallium nitride system compound semiconductor $((Al_xGa_{1-x})_yIn_{1-y}N$, the cleaved plane of the semiconductor multilayer is out of the cleaved plane of the sapphire crystal which is a substrate. The direction of cleaving the substrate is inclined by 2.5 through 3.5° from the plane R of the sapphire crystal and simultaneously, is inclined by 59.5 through 60.5° from the plane C. The cleavage plane of the semiconductor multilayer is found out suitable to ensure the higher smooth property. The cleaving in this direction assumes somewhat stair shape in the cleavage plane of the sapphire substrate, and the cleavage plane of the semiconductor multilayer becomes smoother.

The cleavage of such direction has the microscopic groove of about 10 through 200 μm in depth formed previously for the angle relation on the reverse plane side of the substrate and is cleaved along the groove at the division after the formation of the semiconductor multilayer. Also, as described above, a method of forming linear microcrack lines with a diamond needle point pen and giving mechanical or thermal stressing to it.

Although in the above example, the major plane for forming the semiconductor multilayer of the monocrystal sapphire substrate is made an plane A, the major plane 11 can be made a plane C as shown in FIG. 5. In this case, the plane R which is a cleavage plane is not vertical to the major plane 11, but has an inclination of about 57.62°. Even in this case, the plane can be cleaved along the plane R and the substrate can be divided, so as to obtain the smooth division plane. The major plane of the substrate can be made planes except for plane A, plane C. It is confirmed that even in any case, no influences are given to the crystal orientation of GaN grown on the major plane.

In the other embodiments of the monocrystal sapphire substrate of the invention, Si can be grown on the substrate to make a SOS (Silicon on sapphire) device with the use of the monocrystal sapphire substrate 1, LED, a light emitting device such as laser diode or the like can be made by formation of the semiconductor thin film such as SiC system ZnSe system, Zn system, a SAW (Surface Acoustic Wave) filter by the formation of the piezo-electric thin film such as ZnO, AlN or the like, form the superconductor thin film such as TiSrO$_3$ or the like, and form the thin film such as HgCdTe or the like. Furthermore, the monocrystal sapphire substrate 10 can be applied even for the substrate of a hybrid integrated circuit.

Furthermore, the monocrystal sapphire substrate of the invention, when the thin film or the element pattern are formed as described above, and then, are divided into chip shape into the semiconductor parts or the other electronic parts, can conduct the division of the monocrystal sapphire substrate with higher precision, quickly and in mass production by the application of the dividing method of the invention using the cleaving of the plane R. Also, efficient dividing of the substrate can be conducted by the formation of the reference plane vertical or parallel to the plane R on the monocrystal sapphire substrate. As the division plane is a smooth plane of high precision in the division plane, the semiconductor element, electronic parts of high performance can be obtained.

Since the invention has a reference plane parallel to or vertical to the plane R on the monocrystal sapphire substrate as described in detail above, the direction of plane R to be divided can be identified easily, so as to efficiently divide with the maximum use of the area of the monocrystal sapphire substrate.

According to the invention, the monocrystal sapphire substrate can be divided into many substrates provided with smooth cleavage plane higher in precision only with a step of cleaving the sapphire monocrystal along the plane R, so as to use this process for mass production of the semiconductor element and other electronic parts. Since an acute edge can be formed with the division of the sapphire monocystal into smooth cleavage plane of higher in precision, the sapphire monocrystal can be used as a component member for sapphire cutter or the like.

Further, the semiconductor laser element is a laser diode, which is provided with the plane R in the thickness direction of the monocrystal sapphire substrate, and has a semiconductor multilayer, for constituting the laser light emitting element, formed on the major plane. Since the cleaved plane of the semiconductor multilayer connected with the cleavage plane with the sapphire substrate being cleaved along the plane R is made a reflection plane of the resonator, the light emitting element can be made higher in light emitting efficiency, because the surface smoothness of the reflection plane is higher and the parallelism of both the reflection planes is higher.

Furthermore, in a method of manufacturing the semiconductor laser element comprises the steps of forming the semiconductor multilayer for composing the laser light emitting element on the major plane of the monocrystal sapphire substrate provided with the plane R in the thickness direction, cleaving the sapphire substrate along the plane R, making the cleavage plane of the semiconductor multilayer connected with the cleaved plane the reflection plane of the resonator, the surface smoothness of the reflection plane is higher, the parallelism of both the reflection plane is higher, and the cleaving along the plane R is extremely easier to conduct, thus improving the working property and the productivity of the laser diode manufacturing operation.

What is claimed is:

1. A semiconductor device comprising: a substrate formed of a sapphire monocrystal, the substrate having a major face and a side face, the side face being a cleavage plane parallel to a plane R of the sapphire monocrystal; and a semiconductor element formed on the major face of the sapphire substrate: and a microcrack line on the major face parallel to the plane R for starting to cleave the substrate.

2. The device of claim 1, wherein the semiconductor element is a laser diode having a laser light-emitting semiconductor multilayer formed on the major face of the substrate, wherein the side cleavage plane of the sapphire substrate is connected with a side cleavage plane of the multilayer.

3. The device of claim 1, wherein the major face is a plane A of the sapphire mono-crystal and has a surface roughness (Ra) of 0.1 μm or less.

* * * * *